United States Patent [19]

Hongu et al.

[11] 4,163,196
[45] Jul. 31, 1979

[54] DEMODULATING APPARATUS WITH PHASE SHIFT COMPENSATION

[75] Inventors: Masayuki Hongu, Kawasaki; Masaharu Tokuhara; Yoshihiro Yamamoto, both of Tokyo; Hiromi Kawakami, Yokohama, all of Japan

[73] Assignee: Sony Corporation, Tokyo, Japan

[21] Appl. No.: 891,279

[22] Filed: Mar. 29, 1978

[30] Foreign Application Priority Data

Apr. 4, 1977 [JP] Japan .............................. 52-38406

[51] Int. Cl.² .......................... H03D 1/06; H03D 3/18
[52] U.S. Cl. .................................... 329/50; 329/101;
329/137; 329/140; 329/145; 329/194
[58] Field of Search ............. 329/50, 101, 145, 163,
329/164, 166, 192, 194, 137, 140; 325/487, 328,
329, 330, 331

[56] References Cited

U.S. PATENT DOCUMENTS

| | | | |
|---|---|---|---|
| 2,227,902 | 1/1941 | Hahnle | 325/328 |
| 3,603,890 | 9/1971 | Camenzind et al. | 329/101 |
| 3,921,073 | 11/1975 | Pexa | 325/329 X |

Primary Examiner—Siegfried H. Grimm
Assistant Examiner—Edward P. Westin
Attorney, Agent, or Firm—Lewis H. Eslinger; Alvin Sinderbrand

[57] ABSTRACT

Demodulating apparatus for a modulated signal comprised of a carrier deriving circuit which is supplied with the modulated signal and which derives an unmodulated carrier therefrom, the carrier deriving circuit including a tuned circuit having a center frequency substantially coincident with the carrier frequency of the modulated signal and a limiter circuit in which the limiter circuit imparts a phase shift to the signal supplied thereto in connection with its elimination of the amplitude fluctuations in the signal produced by the tuned circuit. A synchronous detector receives the modulated signal and the derived carrier so as to detect the modulated signal with the derived carrier. A phase shift circuit supplies the synchronous detector with a phase shifted modulated signal, the phase shift substantially compensating for the phase shift imparted by the limited circuit in the carrier deriving circuit, whereby the modulated signal and the carrier which are applied to the synchronous detector are substantially in phase with each other.

11 Claims, 6 Drawing Figures

DEMODULATING APPARATUS WITH PHASE SHIFT COMPENSATION

BACKGROUND OF THE INVENTION

This invention relates to demodulating apparatus and, more particularly, to demodulating apparatus of the type which includes a synchronous detector for detecting an amplitude modulated signal.

One example of a synchronous detector is described in U.S. Pat. No. 3,241,078. In using a synchronous detector to demodulate an amplitude modulated signal, it is necessary to generate or derive a local carrier whose frequency is equal to the frequency of the carrier upon which the amplitude modulating signal is modulated. This local carrier is supplied to one input of the synchronous detector and the amplitude modulated signal is supplied to another input thereof. The resultant output of the synchronous detector is the information signal which had been used to modulate the carrier in producing the amplitude modulated signal.

If the synchronous detector is used in radio wave receiving apparatus, for example, in a television receiver, a radio receiver, or the like, the received high frequency signal first is converted to an intermediate frequency (IF) signal, and the synchronous detector demodulates this IF signal. For example, when used to receive a television signal, the IF signal generally includes an IF carrier of about 58.75 MHz, which is an amplitude modulated signal. This IF signal is applied directly to one input of the synchronous detector, and a carrier deriving circuit is connected to receive the IF signal and to derive a substantially unmodulated IF carrier which is applied to another input of the synchronous detector.

In apparatus of the aforedescribed type, the IF carrier deriving circuit may include a tuned circuit followed by a series-connected limiter circuit. If the tuned circuit is tuned to the IF carrier frequency of 58.75 MHz, then this carrier will be derived and supplied through the limiter circuit to the synchronous detector. The function of the limiter circuit is to remove level variations, or modulations, in the IF carrier derived by the tuned circuit so as to supply a substantially unmodulated IF carrier to the synchronous detector. For proper operation of the synchronous detector, the phase of the local carrier which is supplied thereto by the carrier deriving circuit should be coincident with the phase of the amplitude modulated signal which also is supplied to the synchronous detector. However, the limiter circuit generally imparts a phase delay to the local carrier which is derived from the amplitude modulated IF signal.

In demodulating apparatus of the type described, it heretofore has been proposed that the inherent phase shift in the limiter circuit be compensated, or cancelled, by providing an equal and opposite phase shift in the tuned circuit. That is, if the limiter circuit imparts a phase delay, then the tuned circuit should add a phase advance to the carrier derived thereby. This is achieved by establishing the center frequency of the tuned circuit to be different from the IF carrier frequency of 58.75 MHz. It is known that a tuned circuit exhibits a particular phase-frequency characteristic such that a positive or negative phase shift is imparted to the derived carrier, the degree and direction of this phase shift being dependent upon the difference between the frequency of the derived carrier and the center frequency of the tuned circuit. For example, a positive phase shift, or phase advance, is imparted to the derived carrier if the frequency of the derived carrier is less than the center frequency of the tuned circuit. Therefore, in order to compensate for the phase delay attributed to the limiter circuit, the center frequency of the tuned circuit is set to be higher than the desired IF carrier frequency of 58.75 MHz.

One problem in establishing the center frequency of the tuned circuit to be different than the derived carrier frequency is that the amplitude of the derived carrier produced by the tuned circuit may be less than the input limiting level of the limiter circuit. That is, the amplitude-frequency characteristic of the tuned circuit may appear as a bell-shaped curve having sharply sloped flanks. Thus, since the desired carrier frequency differs from the center frequency of the tuned circuit, the corresponding amplitude of the carrier derived thereby may be relatively low. If this low amplitude carrier is less than the limiting level of the limiter circuit, the level of the carrier which is supplied to the synchronous detector may be less than the desired, limited level. Furthermore, because the carrier supplied to the limiting circuit is less than the limiting level, there may be fluctuations in the amplitude of the carrier which is applied from the limiting circuit to the synchronous detector. Consequently, proper synchronous detection of the amplitude modulated signal might not be achieved. This problem is further compounded if the tuned circuit includes a trap circuit to trap the audio signals which are modulated onto another carrier and which generally are provided in the IF signal. This trap circuit tends to further increase the slope of the flanks of the amplitude-frequency characteristic of the tuned circuit.

OBJECTS OF THE INVENTION

Therefore, it is an object of the present invention to provide improved demodulating apparatus which overcomes the problems and defects described above.

Another object of this invention is to provide improved demodulating apparatus of the type which includes a synchronous detector.

A further object of this invention is to provide demodulating apparatus having a synchronous detector supplied with a modulated signal and further including a carrier deriving circuit for supplying a carrier to the synchronous detector, the carrier being derived from the modulating signal, and further including a phase shifter for shifting the phase of the modulated signal supplied to the synchronous detector by an amount which is equal to the inherent phase shift associated with the carrier deriving circuit, whereby the carrier and demodulated signal supplied to the synchronous detector are in phase with each other.

Yet another object of this invention is to provide demodulating apparatus having a synchronous detector to which a modulated signal is applied, and including a tuned circuit for deriving a local carrier from the modulated signal, the tuned circuit having a center frequency which is equal to the carrier frequency of the modulated signal, the local carrier also being applied to the synchronous detector for detecting the modulating signal from the modulated signal.

Various other objects, advantages and features of the present invention will become readily apparent from the ensuing detailed description, and the novel features will be particularly pointed out in the appended claims.

SUMMARY OF THE INVENTION

In accordance with the present invention, demodulating apparatus is provided with a synchronous detector for demodulating a modulated signal. A carrier deriving circuit is supplied with the modulated signal to derive an unmodulated carrier therefrom, the carrier deriving circuit including a tuned circuit having a center frequency substantially coincident with the carrier frequency of the modulated signal and a limiter circuit for eliminating amplitude fluctuations in the signal produced by the tuned circuit, the limiter circuit imparting a phase shift to the signal supplied thereto in connection with its elimination of the amplitude fluctuations. The carrier derived by the carrier deriving circuit is supplied to one input of the synchronous detector and the modulated signal is supplied to another input of the synchronous detector. A phase shifting circuit is used to supply the modulated signal to the synchronous detector so as to impart a phase shift to the modulated signal which substantially compensates for the phase shift imparted by the limiter circuit in the carrier deriving circuit, whereby the modulated signal and the carrier which are supplied to the synchronous detector are substantially in phase with each other.

BRIEF DESCRIPTION OF THE DRAWINGS

The following detailed description, given by way of example, will best be understood in conjunction with the accompanying drawings in which.

DETAILED DESCRIPTION OF CERTAIN PREFERRED EMBODIMENTS

Figure 1:
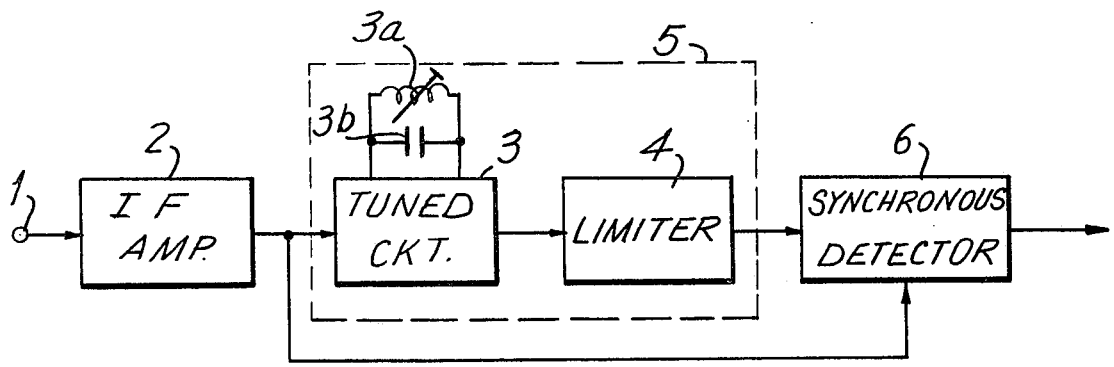
FIG. 1 is a block diagram of one type of demodulating apparatus which includes a synchronous detector signal.

Referring now to the drawings, wherein like reference numerals are used throughout, and in particular to FIG. 1, there is illustrated one embodiment of demodulating apparatus of the type which includes a synchronous detector and which is particularly adapted to demodulate an amplitude modulated signal. For the purpose of the present discussion, it will be assumed that the demodulating apparatus shown in FIG. 1 is operable to demodulate an amplitude modulated television signal. However, and as will be recognized, this demodulating apparatus can be used to demodulate other types of modulated signals. The demodulating apparatus includes an intermediate frequency (IF) amplifier 2, a carrier deriving circuit 5 and a synchronous detector 6. IF amplifier 2 is adapted to receive an amplitude modulated signal supplied thereto from an input terminal 1. If the demodulating apparatus is used to demodulate an amplitude modulated video signal, then the signal supplied to the IF amplifier is an amplitude modulated IF signal supplied from a video IF section, and the output of IF amplifier 2 is an amplitude modulated signal having a carrier frequency of about 58.75 MHz. The output of IF amplifier 2 is connected to one input of synchronous detector 6 and, additionally, to an input of carrier deriving circuit 5.

The carrier deriving circuit is adapted to derive a carrier from the amplitude modulated IF signal supplied thereto by IF amplifier 2. For this purpose, carrier deriving circuit 5 includes a tuned circuit 3, having tuning components 3a and 3b constituted by a variable inductance and a capacitance, respectively, the tuned circuit being connected to the output of IF amplifier 2, and a limiter circuit 4 which is connected in cascade with tuned circuit 3. Tuned circuit 3 extracts the carrier whose frequency is 58.75 MHz from the amplitude modulated IF signal supplied thereto by IF amplifier 2. Limiter circuit 4 is adapted to eliminate amplitude fluctuations in the extracted carrier and to supply a substantially unmodulated carrier to synchronous detector 6. Hence, the carrier of constant amplitude which is applied to the synchronous detector is used therein to detect the modulating signal included in the amplitude modulated IF signal supplied by IF amplifier 2.

Ideally, the center frequency of tuned circuit 3, which is determined by inductance 3a and capacitance 3b, is equal to the 58.75 MHz frequency of the IF carrier. Thus, the extracted carrier supplied to limiter circuit 4 by the tuned circuit would be of maximum amplitude. However, limiter circuit 4 imparts a phase delay to the extracted carrier, thereby resulting in a phase displacement of the carrier which is supplied to synchronous detector 6 relative to the amplitude modulated signal which also is supplied thereto. To correct for this imparted phase delay, the center frequency of tuned circuit 3 is shifted, or offset, from the ideal carrier frequency.

Figure 2:
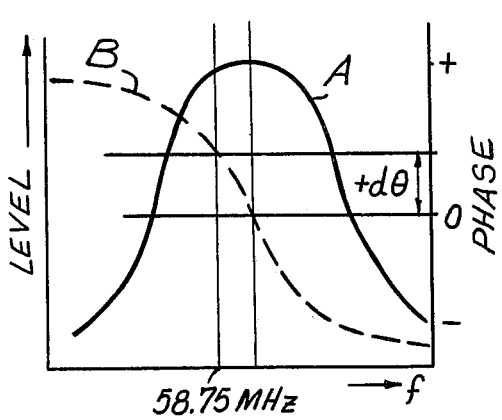
FIG. 2 is a graphical representation of the phase and frequency characteristics of the tuned circuit used in the demodulating apparatus shown in FIG. 1.

Referring now to the graphical representation shown in FIG. 2, the solid curve A represents the amplitude-frequency characteristic of the tuned circuit, and the broken curve B represents the phase-frequency characteristic thereof. As shown, the amplitude-frequency characteristic is in the shape of a bell curve whose peak corresponds to the center frequency of the tuned circuit. If the frequency of the signal supplied to the tuned circuit differs from this carrier frequency, it is seen that the amplitude of the output signal is reduced from the indicated maximum amplitude. Furthermore, although the tuned circuit imparts a zero degree phase shift to an input signal whose frequency is equal to the center frequency of the tuned circuit, a gradually increasing, positive phase shift, or phase advance, is imparted to the output signal of the tuned circuit as the frequency of this output signal decreases from the center frequency; while an increasingly negative phase shift, or phase delay, is added to the output signal of the tuned circuit as the frequency of this output signal progressively increases with respect to the center frequency. If it is assumed that the phase delay attributed to limiter circuit 4 is equal to $d\theta$, then this phase delay will be corrected, or cancelled, if tuned circuit 3 imparts a phase advance of $+d\theta$ to the output signal produced thereby. As shown by curve B in FIG. 2, this phase of $+d\theta$ will be imparted to a carrier whose frequency is 58.75 MHz if the center frequency of the tuned circuit is greater than this frequency. Accordingly, in order to compensate for the phase delay due to limiter circuit 4, tuned circuit 3 has a center frequency which is greater than the IF carrier frequency. This center frequency of the tuned circuit is, of course, established by suitably selecting inductance 3a and capacitance 3b. Therefore, by providing the tuned circuit with the frequency characteristics shown in FIG. 2, any inherent phase shift due to limiter circuit 4 will be compensated; and the derived local carrier which is supplied to synchronous detector 6 by carrier deriving circuit 5 is in phase with the amplitude modulated signal supplied to the synchronous detector by IF amplifier 2. Consequently, a proper synchronous detection operation is performed and the original information signal which had been used as the modulating signal is produced at the output of synchronous detector 6.

It is preferred that the Q of tuned circuit 3 be relatively high. This means that the slope of the flanks of curve A (FIG. 2) likewise is high. Consequently, as the frequency of the carrier which is extracted by tuned circuit 3 differs from the center frequency of the tuned circuit, the amplitude of that extracted carrier is substantially reduced. For the characteristic shown in FIG. 2, the amplitude of the extracted 58.75 MHz carrier is significantly less than the peak amplitude associated with the center frequency of the tuned circuit. This reduced amplitude in the extracted carrier may be less than the limiting level of limiter circuit 4. That is, the amplitude of the carrier which is supplied to the limiter circuit by tuned circuit 3, at the 58.75 MHz carrier frequency, may be such that the limiting operation of the limiter circuit is insufficient to amplify the extracted carrier up to the constant, amplitude-limited level. As a result, changes in the level of the signal supplied to tuned circuit 3 by IF amplifier 2 might not be adequately eliminated by limiter circuit 4. Hence, the carrier supplied to synchronous detector 6 by carrier deriving circuit 5 may exhibit a fluctuating amplitude. As a result thereof, there is a good possibility that proper synchronous detection of the modulating signal may not be achieved. Thus, errors may be provided in the output signal produced by the synchronous detector.

As is known, the output of the IF amplifying section in a television receiver also includes an audio signal component. Although the audio signal is derived from the IF signal by separate demodulating circuitry, the audio signal must be blocked, or "trapped", from affecting the local carrier which is derived by carrier deriving circuit 5. To this effect, tuning components 3a and 3b shown in FIG. 1 may additionally perform a trapping function so as to form a trap circuit, shown schematically in FIG. 3. This trap circuit here is illustrated as series-connected parallel tuned circuits, the first parallel tuned circuit being formed of inductance 3c and capacitance 3d, and the second parallel tuned circuit being formed of inductance 3e and capacitance 3f. This trap circuit, in addition to being tuned to a center frequency, provides substantial attenuation to the IF frequency of 54.25 MHz, the IF carrier upon which the audio signal is modulated.

Figure 3:
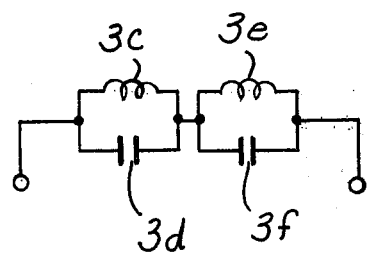
FIG. 3 is a circuit diagram showing an embodiment of the tuning components which can be used with the tuned circuit shown in FIG. 1.
Figure 4:
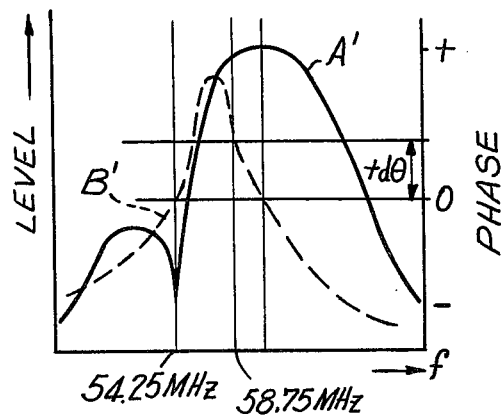
FIG. 4 is a graphical representation of the frequency and phase characteristics of the tuned circuit shown in FIG. 1 when the embodiment shown in FIG. 3 is used therewith.

A graphical representation of the frequency characteristics of tuned circuit 3 having the trap circuit shown in FIG. 3 connected therewith is illustrated in FIG. 4. Curve A' is the amplitude-frequency characteristic of the tuned circuit, and curve B' is the phase-frequency characteristic thereof. As is shown, the center, or tuned, frequency of the tuned circuit is greater than the IF carrier frequency of 58.75 MHz. In addition, substantial attenuation is provided at the IF sound carrier frequency of 54.25 MHz, thereby providing the trapping function. As was the case described hereinabove with respect to FIG. 2, when the tuned frequency of tuned circuit 3 is greater than 58.75 MHz, a phase advance of $+d\theta$ is imparted to the extracted carrier having a carrier frequency of 58.75 MHz. A comparison of the amplitude-frequency characteristics of FIGS. 4 and 2 indicates that when the trap circuit is used, the positive-going flank of curve A' has a greater slope, that is, it is even sharper, than the positive-going flank of curve A. Thus, when the trap circuit is used, there is yet a stronger possibility that fluctuations may be present in the local carrier which is supplied to synchronous detector 6 by carrier deriving circuit 5.

It is appreciated that the problem of amplitude fluctuations in the local carrier, and thus, errors in the demodulated information signal, are attributed to the offset center frequency of tuned circuit 3 which, heretofore, has been thought to be necessary in order to compensate for the phase delay imparted to the derived carrier by limiter circuit 4. In accordance with one advantageous feature of the present invention, the tuned circuit which is used to extract the carrier from the modulated IF signal is tuned, or centered, on the IF carrier frequency of 58.75 MHz. Hence, the output of the tuned circuit will exceed the limiting level of limiter circuit 4. Consequently, a local carrier is derived with a substantially constant amplitude. Of course, since the center frequency of the tuned circuit is substantially coincident with the carrier frequency of the IF signal supplied thereto, the tuned circuit does not compensate for the phase delay inherent in limiter circuit 4. In accordance with the present invention, this phase delay is compensated, or corrected, by providing a phase delay in the modulated IF signal supplied to synchronous detector 6 by IF amplifier 2. This is achieved by providing a phase shifting circuit between the IF amplifier and the synchronous detector.

Figure 5:
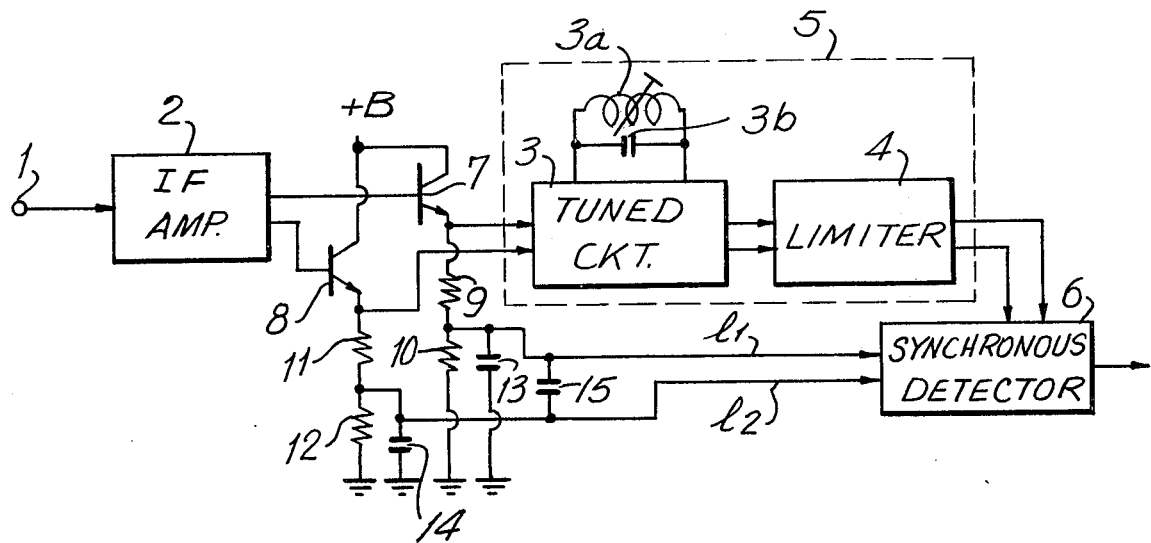
FIG. 5 is a circuit diagram of one embodiment of the present invention.

Turning now to FIG. 5, there is schematically illustrated one embodiment of the present invention, wherein the same reference numerals are used to identify like components which have been described previously with respect to FIG. 1. In a typical synchronous detector, both the modulated signal and the demodulating carrier are supplied thereto differentially. FIG. 5 represents this differential application of signals to synchronous detector 6 by the pair of conductors connected thereto from carrier deriving circuit 5 and from IF amplifier 2. Although these differential connections are not specifically shown in FIG. 1, it should be understood that the signal paths to the synchronous detector shown therein are in the form of differential connections. Hence, as shown more clearly in FIG. 5, synchronous detector 6 includes a pair of inputs coupled to carrier deriving circuit 5 and another pair of inputs coupled to conductors $1_1$ and $1_2$ for receiving the modulated IF signal. The expression "differentially applied", as used herein, means that as the signal amplitude at one input of a pair of inputs to synchronous detector 6 increases, the signal amplitude at the other input in that pair decreases. Consistent with the differential application of the derived carrier to the synchronous detector, IF amplifier 2 is shown as having a pair of outputs, tuned circuit 3 is shown as having a pair of inputs and a pair of outputs, and limiter circuit 4 is shown as having a pair of inputs and a pair of outputs. Thus, the modulated IF signal produced by IF amplifier 2 is a differential signal, and tuned circuit 3 and limiter circuit 4 both are supplied with differential signals to produce differential output signals. Nevertheless, the operation of the IF amplifier, tuned circuit and limiter circuit shown in FIG. 5 are substantially identical to the operation of the corresponding circuits shown in FIG. 1.

In FIG. 5, a pair of emitter-follower transistors 7 and 8 is connected to the differential output terminals of IF amplifier 2 for receiving the modulated IF signal which is differentially applied to such emitter-follower transistors. The emitter electrodes of these emitter-follower transistors are connected to the pair of inputs of tuned circuit 3 so as to supply the modulated IF signal differentially to the tuned circuit. As before, the tuned circuit functions to extract the IF carrier from the supplied modulated IF signal, and this carrier is amplitude-limited by limiter circuit 4 and then differentially applied to synchronous detector 6.

The emitter electrodes of emitter-follower transistors 7 and 8 are connected via respective resistors 9 and 11 to low-pass filters formed of parallel-connected RC circuits. In particular, the low-pass filter connected to the emitter electrode of emitter-follower transistor 7 by resistor 9 is formed of a resistor 10 connected in parallel with a capacitor 13, this RC circuit being further connected to a reference potential, such as ground. A similar low-pass filter is connected via resistor 11 to the emitter electrode of emitter-follower transistor 8, and is formed of a resistor 12 connected in parallel with a capacitor 14, this parallel-connected RC circuit being further coupled to ground. Yet another low-pass filter is connected to the emitter electrodes of transistors 7 and 8, this additional low-pass filter being formed of the series connection of resistor 9, a capacitor 15 and resistor 11. That is, resistors 9 and 11 are included in this further low-pass filter, whereby this further low-pass filter is coupled to the emitter-follower transistors. The output of the further low-pass filter is derived across capacitor 15, whereby the opposite terminals of this capacitor are connected to conductors $l_1$ and $l_2$ which, in turn, are connected to the illustrated pair of inputs of synchronous detector 6. In a preferred embodiment, each of capacitors 13, 14 and 15 is not a lumped capacitance element. Rather, each capacitor represents the stray capacity associated with conductors $l_1$ and $l_2$. In particular, capacitor 13 represents the stray capacity between conductor $l_1$ and ground, and capacitor 14 represents the stray capacity between conductor $l_2$ and ground. Capacitor 15 represents the stray capacity between conductors $l_1$ and $l_2$ and, primarily, the stray capacity at the input to synchronous detector 6.

If resistor 9 is greater than resistor 10 and if resistor 11 is greater than resistor 12, and, further, if the capacitance of stray capacitor 15 is greater than the capacitance of stray capacitors 13 or 14, then a low-pass filter $L_1$ may be thought of as being formed of resistor 9 and stray capacity 13, a low-pass filter $L_2$ may be thought of as being formed of resistor 11 and stray capacity 14 and a low-pass filter $L_3$ may be thought of as being formed of resistor 9, stray capacity 15 and resistor 11. The comulative effect of low-pass filters $L_1$, $L_2$ and $L_3$ is to shift the phase of the modulated IF signal by an amount which corresponds to a phase delay of $d\theta$. This phase delay is equal to the phase delay attributed to limiter circuit 4. Therefore, since the undesired phase delay inherent in carrier deriving circuit 5 is compensated or corrected by the phase shifting circuit formed of low-pass filters $L_1$, $L_2$ and $L_3$, there is no need to offset the center frequency of tuned circuit 3 so as to produce a phase shift in the carrier derived thereby. This means that the center frequency of tuned circuit 3 is coincident with the IF carrier frequency, here assumed to be 58.75 MHz, so that a maximum amplitude in the extracted carrier is provided at the output of the tuned circuit. That is, the gain of the tuned circuit is at its maximum for the IF carrier frequency. This, of course, differs from the gain of the tuned circuit used in the embodiment of FIG. 1 and graphically represented in FIGS. 2 and 4. Since the extracted carrier is of a sufficiently high amplitude at the output of tuned circuit 3, this carrier exceeds the limiting level of limiter 4 and, therefore, a substantially constant local carrier is differentially supplied to synchronous detector 6 by limiter circuit 4. Thus, a proper information signal is demodulated by the synchronous detector.

Figure 6:
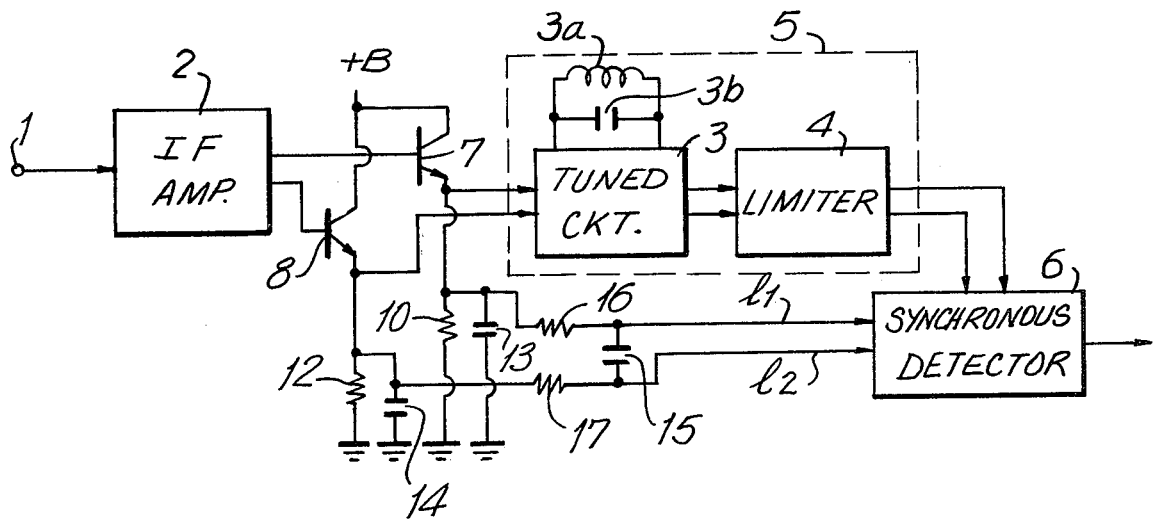
FIG. 6 is a circuit diagram of another embodiment of the present invention.

As mentioned above, the capacitances of stray capacities 13 and 14 each are relatively low in comparison with the capacitance of stray capacity 15. Accordingly, the phase shifts imparted to the modulated IF signal by low-pass filters $L_1$ and $L_2$ is negligible when compared to the phase shift due to low-pass filter $L_3$. Because of this negligible phase shift attributed to low-pass filters $L_1$ and $L_2$, the embodiment shown in FIG. 5 can be modified as shown in FIG. 6. In this latter embodiment, low-pass filter $L_3$ still is formed of a series circuit comprised of a resistor, a capacitor and another resistor, connected between the respective emitter electrodes of transistors 7 and 8, but the RC circuits formed of resistor 10 and capacitor 13, and resistor 12 and capacitor 14, now are connected directly to the emitter electrodes of these transistors. Thus, resistors 9 and 11 of FIG. 5 now are replaced by resistors 16 and 17, respectively, of FIG. 6. A series RC circuit is connected from the emitter electrode of transistor 7, and formed of resistor 16, capacitor 15 and resistor 17, to the emitter electrode of transistor 8. That is, resistor 16 is connected to the junction defined by the emitter electrode of transistor 7 and the RC circuit formed of resistor 10 and capacitor 13, and resistor 17 is connected to the junction defined by the emitter electrode of transistor 8 and the RC circuit formed of resistor 12 and capacitor 14. Nevertheless, conductors $l_1$ and $l_2$ are connected to the opposite terminals of capacitor 15 so as to supply the phase-shifted modulated IF signal differentially to synchronous detector 6. A phase delay of $d\theta$ is provided primarily by low-pass filter $L_3$ formed of resistor 16, capacitor 15 and resistor 17. The operation of the embodiment shown in FIG. 6 is, therefore, substantially the same as the operation of the embodiment shown in FIG. 5. Accordingly, amplitude fluctuations in the local carrier supplied to synchronous detector 6 by carrier deriving circuit 5 are avoided, and a proper detection operation is performed thereby. The avoidance of such amplitude fluctuations in the derived carrier is attributed primarily to providing the center frequency of tuned circuit 3 substantially coincident with the IF carrier frequency.

While the present invention has been particularly shown and described with specific reference to certain preferred embodiments, it will be readily apparent to one of ordinary skill in the art that various changes and modifications in form and details may be made without departing from the spirit and scope of the invention. For example, the tuned circuits shown in the embodiments of FIGS. 5 and 6 may be provided with trap circuits of the type shown in FIG. 3. Furthermore, although emitter-follower transistors are shown herein, these transistors may be replaced by other conventional types of buffer amplifiers, as desired. In addition, one of the differential inputs (or outputs) in each pair illustrated in FIG. 5 may be connected to ground. It is, therefore, intended that the appended claims be interpreted as including these as well as other such modifications and changes.

What is claimed is:

1. Demodulating apparatus comprising means for supplying a modulated signal; carrier deriving means coupled to said means for supplying the modulated signal for deriving an unmodulated carrier signal from said modulated signal, said carrier deriving means including a tuned circuit having a center frequency substantially coincident with the carrier frequency of said modulated signal and a limiter circuit coupled to said tuned circuit for eliminating amplitude fluctuations in the signal supplied thereto by said tuned circuit, said limiter circuit imparting a phase shift to said signal supplied thereto in connection with its elimination of said amplitude fluctuations; synchronous detecting means coupled to said means for supplying the modulated signal and to said carrier deriving means for detecting the modulated signal with said derived carrier signal; and phase shift means connected between said means for supplying and said synchronous detecting means for imparting a phase shift to said modulated signal which substantially compensates for said phase shift imparted by said limiter circuit in said carrier deriving means, whereby the amplitude modulated signal and the carrier applied to said synchronous detecting means are substantially in phase with each other.

2. The apparatus of claim 1 wherein said synchronous detecting means includes a pair of inputs to which the phase shifted modulated signal is differentially applied, and wherein said phase shift means includes a low-pass filter formed of resistance means and capacitance means and having a pair of input terminals for receiving the modulated signal, and a pair of conductors connected to said pair of inputs of said synchronous detecting means, said capacitance means being provided across said pair of conductors.

3. The apparatus of claim 2 wherein said phase shift means further includes a pair of buffer amplifiers connected to said means for supplying and to which said modulated signal is differentially applied, said buffer amplifiers having outputs connected to said pair of input terminals, respectively, of said low-pass filter.

4. The apparatus of claim 3 wherein each of said buffer amplifiers comprises an emitter-follower transistor having an additional low-pass filter connected to the emitter electrode thereof, said additional low-pass filter being formed of parallel-connected resistance means and capacitance means.

5. The apparatus of claim 2, 3 or 4 wherein each said capacitance means is constituted by stray capacitance associated with said conductors.

6. The apparatus of claim 4 wherein the first-mentioned low-pass filter is formed of a first resistor connected to the emitter electrode of one emitter-follower transistor and a second resistor connected to the emitter electrode of the other emitter-follower transistor, and wherein said capacitance means in said first-mentioned low-pass filter is provided across said first and second resistors.

7. The apparatus of claim 6 wherein said first and second resistors each are connected between the emitter electrode of a respective emitter-follower transistor and a respective one of said additional low-pass filters.

8. The apparatus of claim 6 wherein said first and second resistors each are connected to a respective junction defined by the connection of the emitter electrode of a respective emitter-follower transistor and a respective one of said additional low-pass filters.

9. The apparatus of claim 6 wherein said capacitance means in said first-mentioned low-pass filter is greater than each capacitance means in said additional low-pass filters, whereby a substantially greater phase shift is imparted to said modulated signal by said first-mentioned low-pass filter than by said additional low-pass filters.

10. The apparatus of claim 2, 3, 4, 6, 7, 8 or 9 wherein said synchronous detecting means includes an additional pair of inputs to which said derived carrier signal is differentially supplied.

11. Apparatus for demodulating an amplitude modulated signal, comprising supply means for supplying said amplitude modulated signal; carrier deriving means coupled to said supply means for deriving an unmodulated carrier from said amplitude modulated signal, said carrier deriving means including a tuned circuit having a center frequency substantially coincident with the carrier frequency of said amplitude modulated signal and a limiter circuit coupled to said tuned circuit, said limiter circuit imparting a phase shift to said signal supplied thereto in connection with its elimination of said amplitude fluctuations; synchronous detecting means coupled to said carrier deriving means for receiving said carrier differentially applied thereto and coupled to said supply means for receiving said amplitude modulated signal differentially applied thereto, said synchronous detecting means detecting the amplitude modulated signal with said carrier; and phase shift means connected between said supply means and said synchronous detecting means for imparting a phase shift to said amplitude modulated signal which substantially compensates for said phase shift imparted by said limiter circuit in said carrier deriving means, whereby the amplitude modulated signal and the carrier applied to said synchronous detecting means are substantially in phase with each other, said phase shift means including a pair of emitter-follower means having inputs for receiving said amplitude modulated signal differentially applied thereto, a first low-pass filter comprised of an RC circuit coupled to the outputs of said pair of emitter-follower means for shifting the phase of said amplitude modulated signal and to apply the phase-shifted amplitude modulated signal differentially to said synchronous detecting means, and respective additional low-pass filter, each comprised of an RC circuit coupled to the output of a respective one of said pair of emitter-follower means.

* * * * *